US011411135B2

(12) United States Patent
Sharma et al.

(10) Patent No.: US 11,411,135 B2
(45) Date of Patent: Aug. 9, 2022

(54) GALLIUM AND NITROGEN CONTAINING TRIANGULAR OR DIAMOND-SHAPED CONFIGURATION FOR OPTICAL DEVICES

(71) Applicant: KORRUS, INC., Los Angeles, CA (US)

(72) Inventors: Rajat Sharma, Fremont, CA (US); Andrew Felker, Fremont, CA (US); Aurelien J. F. David, San Francisco, CA (US)

(73) Assignee: KORRUS, INC., Los Angeles, CA (US)

( * ) Notice: Subject to any disclaimer, the term of this patent is extended or adjusted under 35 U.S.C. 154(b) by 209 days.

(21) Appl. No.: 15/270,928

(22) Filed: Sep. 20, 2016

(65) Prior Publication Data

US 2017/0012168 A1    Jan. 12, 2017

Related U.S. Application Data

(63) Continuation of application No. 13/357,578, filed on Jan. 24, 2012, now Pat. No. 9,450,143, which is a continuation-in-part of application No. 13/163,482, filed on Jun. 17, 2011, now Pat. No. 8,293,551.

(60) Provisional application No. 61/436,115, filed on Jan. 25, 2011, provisional application No. 61/356,473, filed on Jun. 18, 2010.

(51) Int. Cl.
| | |
|---|---|
| *H01L 33/12* | (2010.01) |
| *H01L 33/20* | (2010.01) |
| *H01L 33/00* | (2010.01) |
| *H01L 33/16* | (2010.01) |
| *H01L 33/32* | (2010.01) |

(52) U.S. Cl.
CPC .......... *H01L 33/12* (2013.01); *H01L 33/0095* (2013.01); *H01L 33/16* (2013.01); *H01L 33/20* (2013.01); *H01L 33/32* (2013.01)

(58) Field of Classification Search
CPC ..... H01L 33/12; H01L 33/0095; H01L 33/16; H01L 33/20; H01L 33/32
USPC ............................................... 257/76; 438/33
See application file for complete search history.

(56) References Cited

U.S. PATENT DOCUMENTS

| | | | | |
|---|---|---|---|---|
| 5,821,568 | A * | 10/1998 | Morita | H01S 5/0201 |
| | | | | 257/94 |
| 6,080,599 | A | 6/2000 | Yamamoto et al. | |
| 6,437,363 | B1 * | 8/2002 | Kadota | H01L 33/007 |
| | | | | 257/103 |
| 7,750,355 | B2 * | 7/2010 | Dwilinski | B82Y 20/00 |
| | | | | 257/103 |
| 9,000,466 | B1 * | 4/2015 | Aldaz | H01L 33/58 |
| | | | | 257/94 |

(Continued)

FOREIGN PATENT DOCUMENTS

| | | |
|---|---|---|
| EP | 1804305 A1 | 7/2007 |
| JP | H0982587 A | 3/1997 |
| WO | 2006068297 A1 | 6/2006 |

OTHER PUBLICATIONS

German Office Action dated Sep. 20, 2018, for German Application No. 112011102068.6, including English translation.

*Primary Examiner* — Igwe U Anya
(74) *Attorney, Agent, or Firm* — FisherBroyles LLP (57) ABSTRACT

A gallium and nitrogen containing optical device has a base region and no more than three major planar side regions configured in a triangular arrangement provided from the base region.

16 Claims, 6 Drawing Sheets

(56) References Cited

U.S. PATENT DOCUMENTS

| | | | |
|---|---|---|---|
| 2002/0028564 A1* | 3/2002 | Motoki | C30B 25/02 |
| | | | 438/460 |
| 2002/0053676 A1* | 5/2002 | Kozaki | B82Y 20/00 |
| | | | 257/88 |
| 2002/0063258 A1* | 5/2002 | Motoki | H01L 33/32 |
| | | | 257/95 |
| 2003/0128729 A1* | 7/2003 | Matsumura | H01S 5/22 |
| | | | 372/46.01 |
| 2004/0051107 A1* | 3/2004 | Nagahama | B82Y 20/00 |
| | | | 257/79 |
| 2004/0113168 A1 | 6/2004 | Eliashevich et al. | |
| 2004/0165635 A1* | 8/2004 | Sugimoto | B82Y 20/00 |
| | | | 372/46.01 |
| 2007/0037308 A1* | 2/2007 | Okuyama | H01L 21/0242 |
| | | | 438/46 |
| 2009/0065900 A1* | 3/2009 | Saito | H01L 33/16 |
| | | | 257/615 |
| 2009/0236693 A1* | 9/2009 | Moustakas | H01L 21/30621 |
| | | | 257/615 |
| 2010/0219416 A1* | 9/2010 | Farrell | H01L 21/02389 |
| | | | 257/E29.089 |
| 2010/0264452 A1* | 10/2010 | Zimmerman | H01L 33/32 |
| | | | 257/99 |
| 2011/0315999 A1* | 12/2011 | Sharma | H01L 33/0095 |
| | | | 257/76 |
| 2012/0175652 A1* | 7/2012 | Chyr | B23K 26/0084 |
| | | | 257/98 |
| 2014/0061861 A1* | 3/2014 | Moustakas | H01L 21/3065 |
| | | | 257/615 |
| 2015/0155439 A1* | 6/2015 | Cich | H01L 33/32 |
| | | | 362/294 |

* cited by examiner

GALLIUM AND NITROGEN CONTAINING TRIANGULAR OR DIAMOND-SHAPED CONFIGURATION FOR OPTICAL DEVICES

CROSS REFERENCE TO RELATED APPLICATIONS

This application is a continuation of U.S. patent application Ser. No. 13/357,578, filed Jan. 24, 2012 which claims priority to U.S. Provisional Application No. 61/436,155, filed Jan. 25, 2011; and is a continuation-in-part of U.S. application Ser. No. 13/163,432, filed Jun. 17, 2011; which claims priority to U.S. Provisional Application No. 61/356,473, filed Jun. 10, 2010, all of which are incorporated herein by reference for all purposes.

BACKGROUND OF THE INVENTION

This invention relates generally to lighting techniques. More specifically, embodiments of the invention include techniques for manufacturing optical devices, such as light emitting diodes (LEDs) using a separation process of thick gallium and nitrogen containing substrate members, such as GaN configured in polar crystalline orientations. In some embodiments, the gallium and nitrogen containing substrate is configured in a triangular shape or a diamond shape. The invention can be applied to applications such as white lighting, multi-colored lighting, general illumination, decorative lighting, automotive and aircraft lamps, street lights, lighting for plant growth, indicator lights, lighting for flat panel displays, and other optoelectronic devices.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates more than 90% of the energy used as thermal energy. Additionally, the conventional light bulb routinely fails often due to thermal expansion and contraction of the filament element.

Solid state lighting techniques are known. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. Additionally, GaN based LEDs have been costly and difficult to produce on a wide-scale in an efficient manner.

BRIEF SUMMARY OF THE INVENTION

Conventional LED fabrication process typically employs a wafer scribing and breaking procedure to generate individual LED chips. These wafers are typically scribed along two substantially orthogonal axes, wherein these individual axes are respectively parallel to and co-planar with two non-equivalent crystal plane orientations of the wafer. For example, for an LED wafer comprising GaN on sapphire singulated into square or rectangular chips, the two orthogonal scribe axes are respectively parallel to and co-planar with m-plane and a-plane orientations of the sapphire wafer, wherein the m-planes and a-planes are not equivalent by definition.

In a specific embodiment, the present method includes a scribe and break process for bulk c-plane GaN wafers. The wafers are scribed along two or more non-orthogonal axes. These two or more axes are respectively parallel to and co-planar with equivalent crystal planes of the GaN wafer. For example, a bulk c-plane GaN wafer is scribed along three axes (with an angle of 60° between each of these three axes) wherein these three axes are respectively parallel to and co-planar with three m-plane orientations of the c-plane GaN wafer. In a specific embodiment, the three m-plane orientations are equivalent by definition. In one or more aspects, the present invention includes a method to fabricate a triangular-shaped or diamond-shaped chip geometry in the case of c-plane GaN wafers, which may have several advantages over conventional square or rectangular geometries. This present invention utilizes the in-plane 6-fold rotational symmetry and crystallography unique to c-plane GaN wafers—GaN has the Wurtzite crystal structure according to a specific embodiment. In an alternative preferred embodiment, the bulk c-plane GaN wafer may be scribed along three axes (with an angle of 60 degrees between each of these three axes) wherein these three axes are respectively parallel to and co-planar with three a-plane orientations of the c-plane GaN wafer, the three a-plane orientations being equivalent by definition.

In a specific embodiment, the present invention provides a gallium and nitrogen containing substrate configured in a triangular shape consisting of no more than five surface regions. Preferably, the five surface regions comprise three surface regions configured from respective first equivalent planes and two surface regions configured from second equivalent planes.

In alternative embodiments, the invention provides a diamond shape substrate consisting of no more than six surface regions. Preferably, the six surface regions comprise four surface regions configured from respective first equivalent planes and two surface regions configured from second equivalent planes. A first surface region configured in a c plane orientation and a second surface region configured in the c-plane orientation. The method also includes exposing at least a first m-plane region, a second m-plane region, and a third m-plane region. Moreover, the present invention provides a method of separating die from a gallium and nitrogen containing substrate. The invention also includes a gallium and nitrogen containing optical device. The device includes a gallium and nitrogen containing substrate having a base region and no more than three major planar side regions configured in a triangular arrangement provided from the base region.

In a preferred embodiment, the present method and structure can include one or more of the following elements that can include variations, modifications, and alternatives.

1. A bulk c-plane GaN wafer with an overlying LED epitaxial structure and with p-type and n-type metallizations is fabricated, such that there are 'scribe streets' along three directions (at 60° angles relative to each other) separating individual LED traces on the wafer. The scribe streets are aligned to be respectively parallel to three m-plane orientations of the c-plane GaN wafer, and are designed to intersect such that the triangle shape defined by three scribe lines is an equilateral triangle.

2. The LED wafer is laser-scribed on a first surface of the wafer, along a first 'scribe street' direction. The scribe depth in the scribed regions on the first surface is typically 20-50% of the thickness of the LED wafer.

3. The LED wafer is then laser-scribed on a first surface of the wafer, along a second 'scribe street' direction. The scribe depth in the scribed regions on the first surface is typically 20-50% of the thickness of the LED wafer.

4. The LED wafer is laser-scribed on a first surface of the wafer, along the third 'scribe street' direction. The scribe depth in the scribed regions on the first surface is typically 20-50% of the thickness of the LED wafer.

5. The scribe depth in the scribed regions on the second surface is typically 20-50% of the thickness of the LED wafer.

6. The scribed LED wafer is then broken using an anvil breaker setup along the three 'scribe street' orientations. Breaking occurs along the planes defined by scribed regions on the first surface of the wafer in a specific embodiment. Breaking along the third 'scribe street' orientation yields individual triangle-shaped LED chips.

In a specific embodiment, the invention provides for a method for singulation of thick c-plane GaN wafers into triangle-shaped LED chips defined by three equivalent m-plane oriented sidewalls. In one or more embodiments, the m-plane is a natural break plane, which easily cleaves, in the case of c-plane GaN wafers, and therefore, a singulation process involving breaking exclusively or predominately along a set of m-plane orientations will have a higher yield than a process involving breaking along both m-plane orientations and a-plane orientations. In another specific embodiment, the present invention provides for a method for singulation of c-plane GaN wafers into triangle-shaped LED chips defined by three equivalent m-plane oriented sidewalls. In one or more embodiments, break along the a-plane yields a characteristic surface texture which results in improved light extraction. I The invention provides triangle-shaped chips characterized by improved light extraction when compared to conventional square- or rectangle-shaped chips, due to an increase in the per-pass probability of escape of in-plane emission arising from a decrease in the probability of total internal reflection at the sidewalls. Additionally, triangle-shaped chips provide fewer trapped trajectories of light than square or rectangle chips, so that the chip light extraction efficiency can be increased.

DETAILED DESCRIPTION OF THE INVENTION

Figure 1:
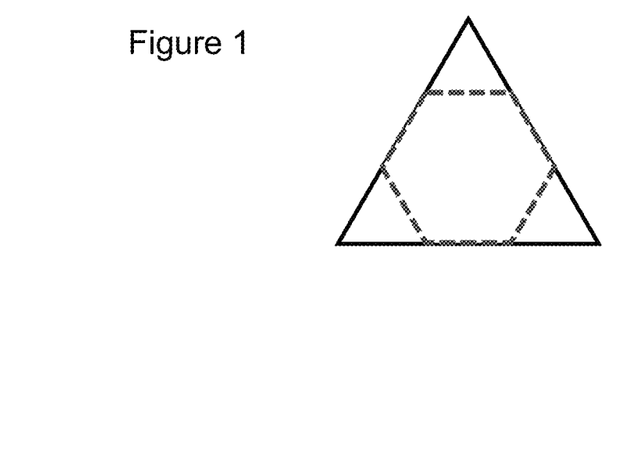
FIGS. 1 through 3 are diagrams illustrating a method for forming triangular shaped gallium and nitrogen containing material.
Figure 2:
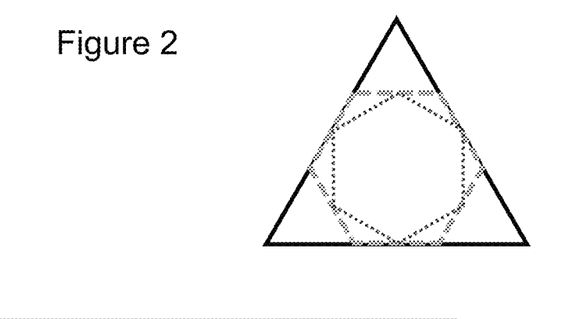
Figure 3:
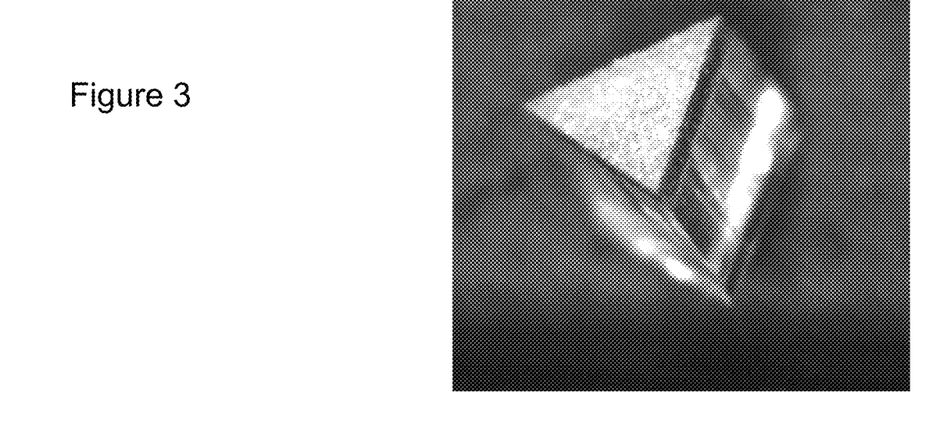

FIGS. 1 through 3 are simplified diagrams illustrating a method for forming a triangular shaped gallium and nitrogen containing material according to an embodiment of the present invention. As shown in FIG. 1, the invention provides a gallium and nitrogen containing substrate member. The member includes a gallium and nitrogen containing thickness of material configured in a triangular shape consisting of no more than five surface regions. Preferably, the five surface regions comprises a three surface regions configured from respective first equivalent planes and the five surface regions excluding the three surface regions comprises two surface regions configured from second equivalent planes. As shown is a top-view of a triangular shaped chip showing orientation of three edges relative to GaN m-planes according to a specific embodiment (see dashed or red lines).

In a specific embodiment, the gallium and nitrogen containing substrate is triangular shaped. The triangular shaped substrate may be an extruded triangular shape. In a specific embodiment, the three surface regions of the triangular shaped regions are respective first equivalent planes, which are either m-planes or a-planes, see FIG. 2. The second surface regions of the triangular shaped regions are respective second equivalent planes, which are c-planes. In a specific embodiment, the gallium and nitrogen containing substrate is a GaN substrate. Of course, there can be other variations, modifications, and alternatives.

In a specific embodiment, the three surface regions of the triangular shaped regions are configured from respective scribes provided on respective first equivalent planes. As an example, the three surface regions are configured by an interior region of 180 Degrees or the like. In other examples, the two surface regions are configured in parallel arrangement to each other.

Referring now to FIG. 3, an optical micrograph of a triangular shaped LED chip is illustrated. As shown, the GaN substrate is configured from bulk c-plane GaN having three m-plane surface orientations exposed. As also shown, the gallium and nitrogen containing member comprises at least an optical device thereon in at least one specific embodiment. The optical device can be a light emitting diode, a laser device, or other device, as well as combinations of optical and electrical devices. Other types of devices can include electrical switching devices, mechanical devices, and any combination of these and the like.

Figure 4:
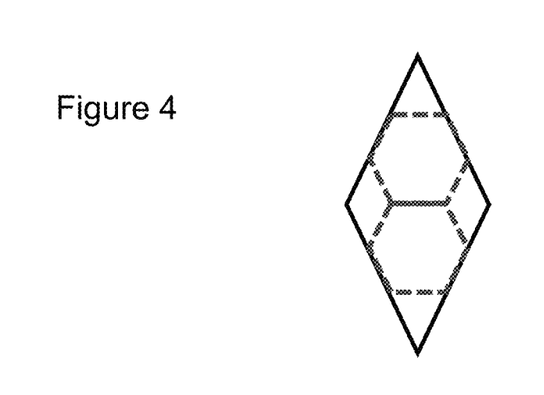
FIGS. 4 through 6 are diagrams illustrating a method for forming a diamond shaped gallium and nitrogen containing material.
Figure 5:
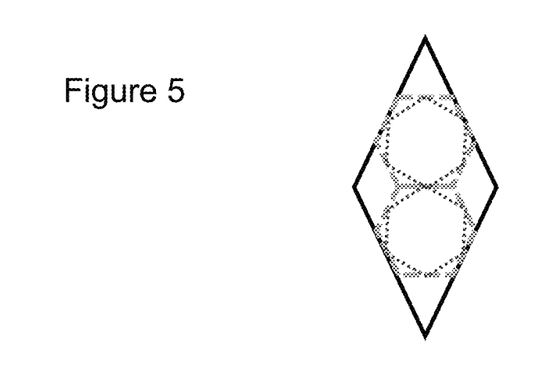
Figure 6:
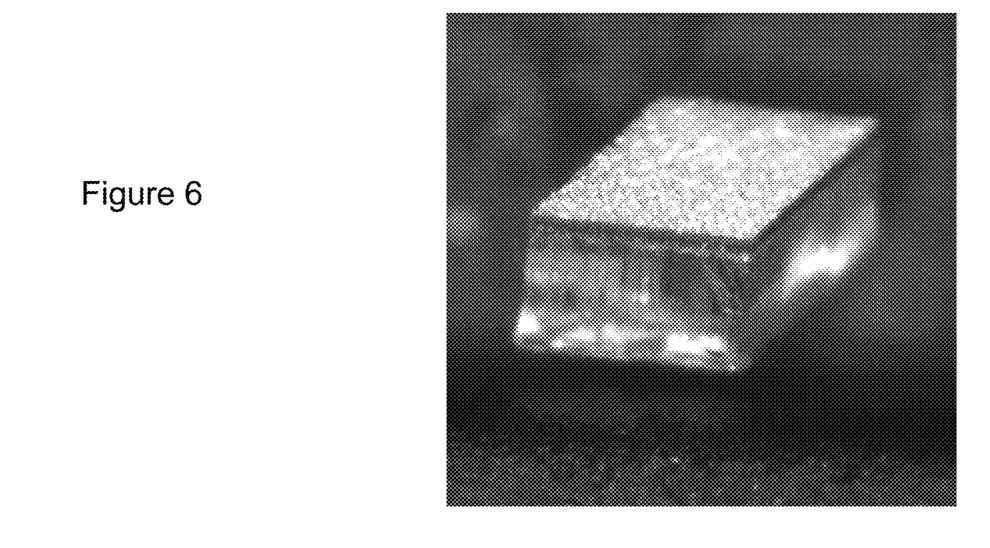

FIGS. 4 through 6 are simplified diagrams illustrating a method for forming a triangular shaped gallium and nitrogen containing material according to an embodiment of the present invention. As shown, the substrate shows four edges relative to GaN m-planes (see dotted or red lines). The substrate member includes a gallium and nitrogen containing thickness of material configured in a diamond shape consisting of no more than six surface regions. Preferably, the six surface regions comprises four surface regions configured from respective first equivalent planes and the six surface regions excluding the four surface regions comprises two surface regions configured from second equivalent planes.

In a specific embodiment, the substrate that is the diamond shape is free from a 90 degree intersection between any two of the first four surface regions out of the six surface regions. In a specific embodiment, the diamond shape includes the first equivalent planes that are either m-planes or a-planes, as illustrated by FIG. 5. As shown, the four edges are associated with GaN a-planes (green dashed lines or dashed lines). In a specific embodiment, the diamond shape includes the second equivalent planes that are c-planes.

The four surface regions of the diamond shape are configured from respective scribes provided on respective first equivalent planes in a specific embodiment. Preferably, the four surface regions are configured by an interior region free from a 90 degree angle. Preferably, the two surface regions are configured in parallel arrangement to each other.

Referring now to FIG. 6, an optical micrograph of a diamond shaped LED chip is illustrated. As shown, the GaN substrate is configured from bulk c-plane GaN having four m-plane surface orientations exposed. As also shown, the gallium and nitrogen containing member comprises at least an optical device thereon in at least one specific embodiment. The optical device can be a light emitting diode, a laser device, or other device, as well as combinations of optical and electrical devices.

Figure 7:
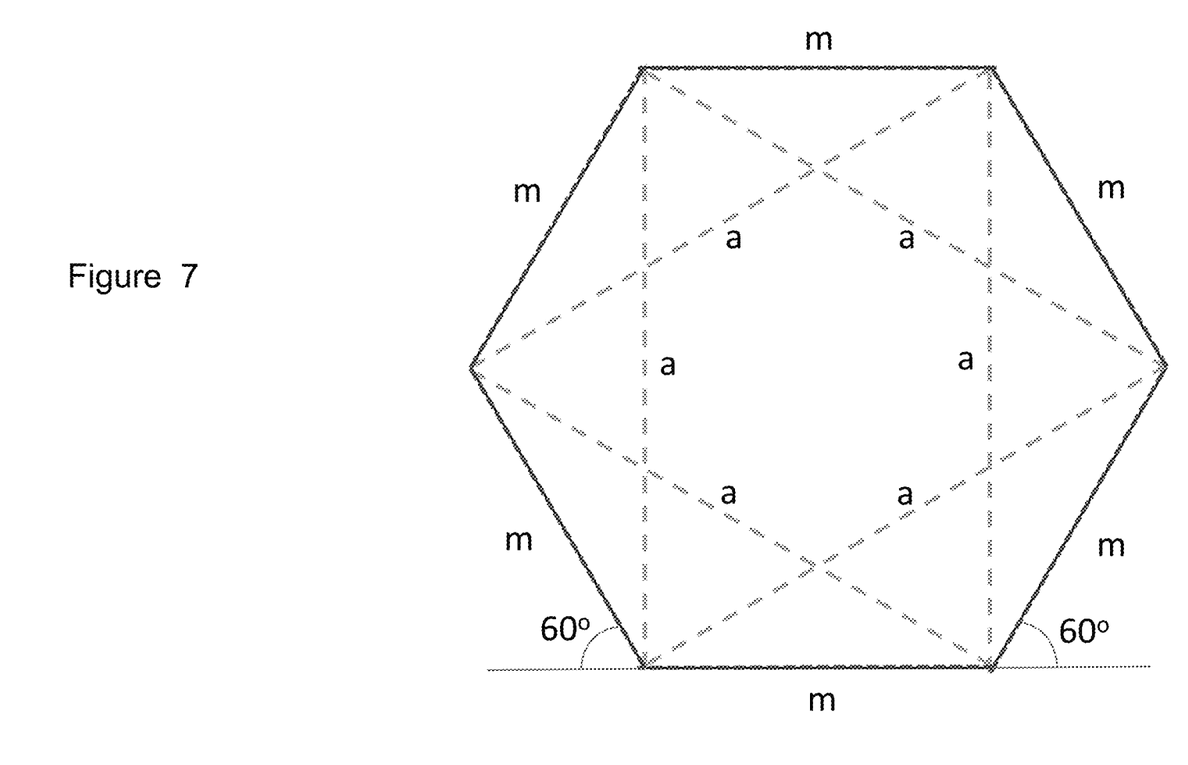
FIG. 7 is a diagram showing relative orientations of m-planes (red lines) and a-planes (green lines), wherein the plane of the diagram represents a c-plane, in the case of the GaN (Wurtzite) crystal structure.

FIG. 7 is a simplified diagram showing relative orientations of m-planes (red lines) and a-planes (green lines), wherein the plane of the diagram represents a c-plane, in the case of the GaN (Wurtzite) crystal structure according to an embodiment of the present invention.

Figure 8:
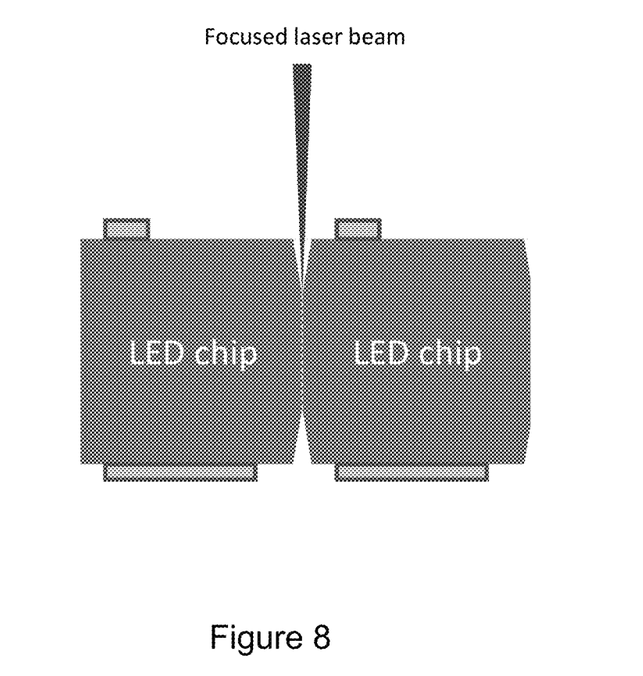
FIG. 8 is a side-view diagram depicting a laser scribing process for an optical device.

FIG. 8 is a simplified side-view diagram depicting a laser scribing process for an optical device according to an embodiment of the present invention. In a specific embodiment, the LED wafer is laser-scribed within the 'scribe streets' on a first surface of the wafer, along one or more axes according to a specific embodiment. In other embodiments, the scribing can occur using a saw, a diamond scribe, a chemical etchant (with or without a photo-assisted component), reactive ion or plasma etchant or milling, or combinations, and the like. The scribe depth in the scribed regions on the first surface is typically 20-50% of the thickness of the LED wafer according to a specific embodiment. In other embodiments, the scribe depth can vary and have other dimension.

In a specific embodiment, the LED wafer is then flipped over, and is then laser-scribed within the 'scribe streets' on a second surface of the wafer, along one or more axes, taking care to ensure that the scribes on the second surface are aligned to be substantially overlying the scribes on the first side of the wafer. In a specific embodiment, the scribe depth in the scribed regions on the second surface is typically 20-50% of the thickness of the LED wafer The scribed LED wafer is then broken using an anvil breaker setup, such as the one further described below.

Figure 9:
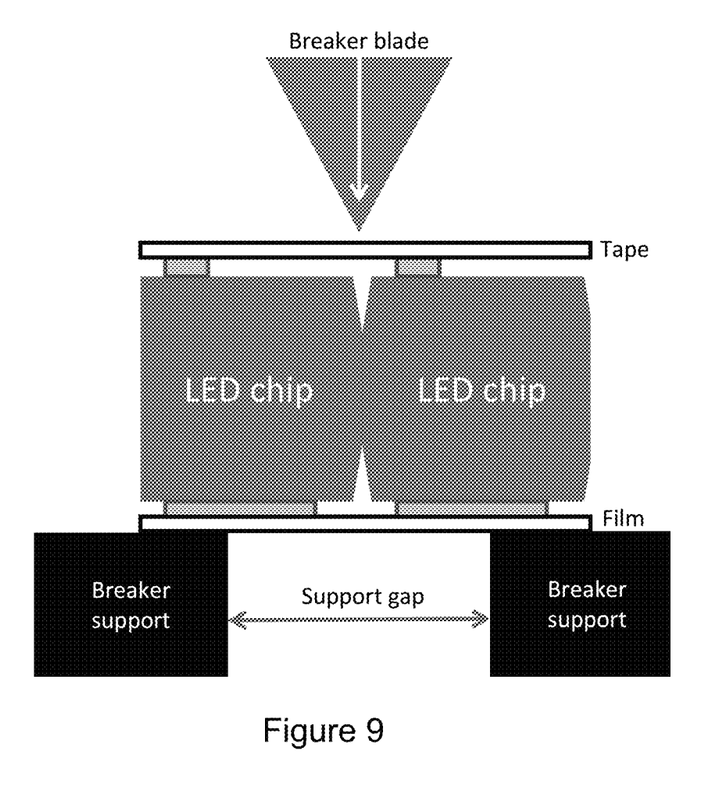
FIG. 9 is a side-view diagram depicting a breaking process for an optical device.

FIG. 9 is a simplified side-view diagram depicting a breaking process for an optical device according to an embodiment of the present invention. As shown, breaking occurs along the planes defined by two aligned scribed regions on the two opposing sides of the wafer. In a specific embodiment, the present method provides for the singulation of thick GaN wafers, thereby eliminating the need for expensive and time-consuming lapping and polishing steps in the LED fabrication process.

Figure 10:
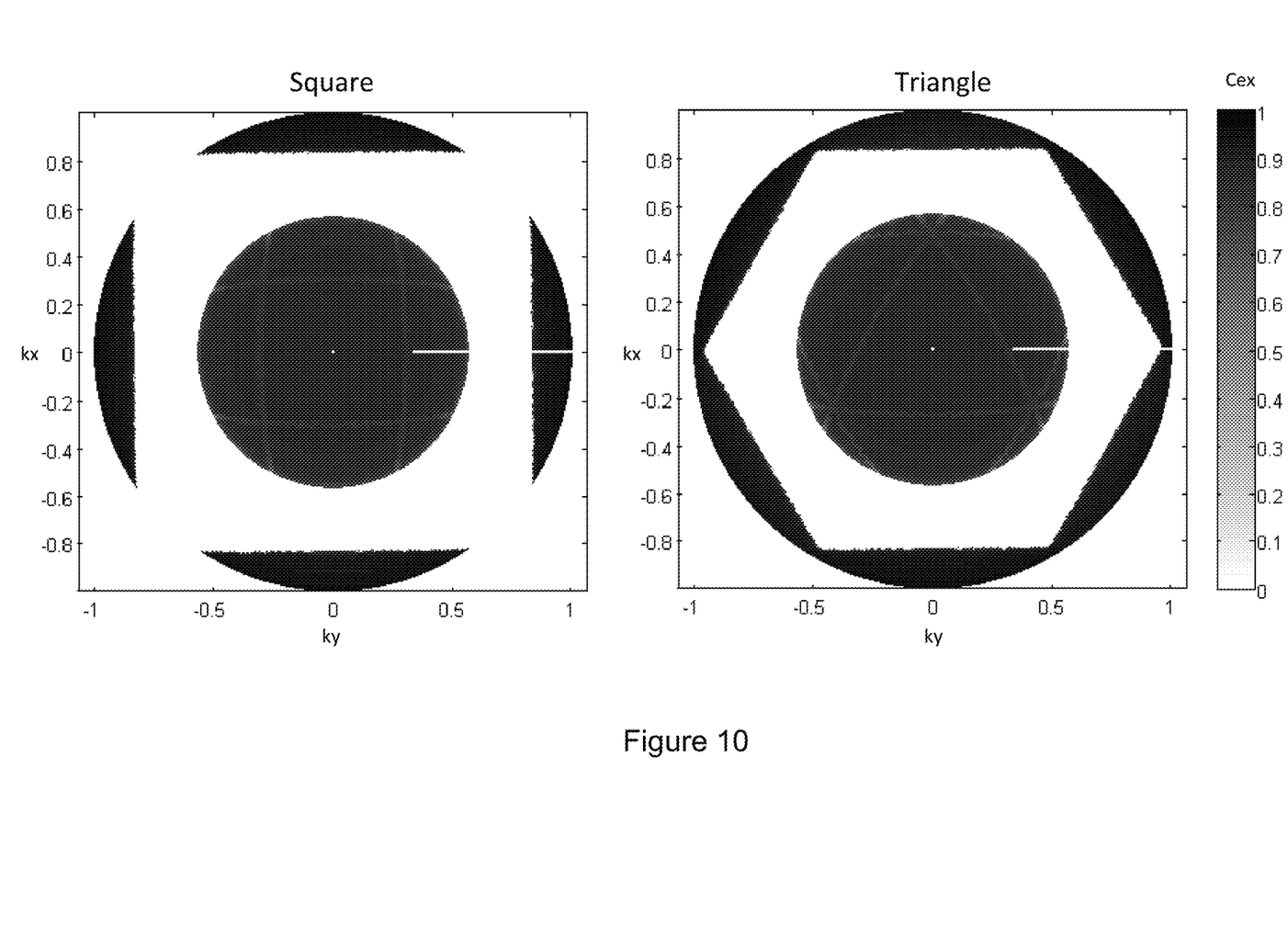
FIG. 10 is the light extraction diagram obtained from modeling light extraction in a square and a triangular chip.

FIG. 10 displays modeling results which compare the light extraction efficiency Cex of square and triangular chips. The simulation yields the light extraction diagram, e.g. the extraction efficiency versus the direction of emission of photons (kx,ky). As can be seen, square chips offer 5 extraction cones (one per face) yielding Cex=46%. Triangular chips offer 7 extraction cones (each vertical sidewall can extract in-plane light directly or after a bounce off another sidewall) yielding Cex=57%. These numbers pertain to realistic structures (including loss in the metals and GaN substrate) and do not integrated any surface roughening of the chip walls.

Figure 11:
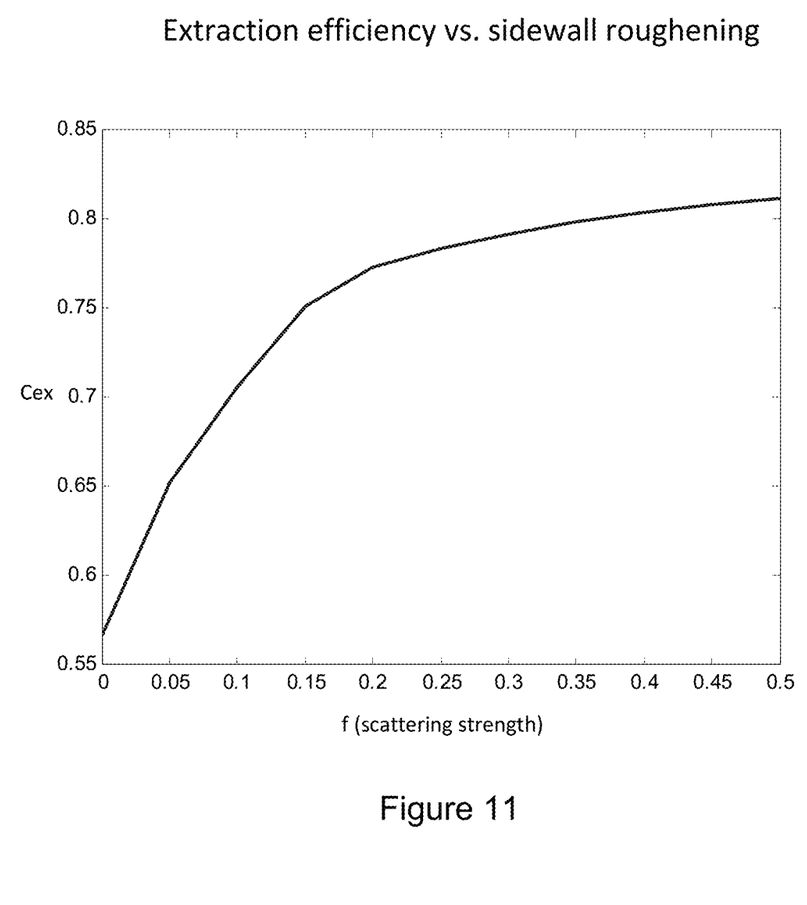
FIG. 11 is a simulation of light extraction efficiency of a triangular chip as a function of sidewall surface roughening.

FIG. 11 illustrates the impact of sidewall roughening on light extraction efficiency, as predicted by modeling. For efficient sidewall roughness, the light extraction efficiency of a triangular chip can exceed 80% (versus 57% for smooth sidewalls).

In a specific embodiment, the present method provides for the singulation of thick GaN wafers into individual LED chips with lateral chip dimensions that are significantly smaller than those enabled by standard single-sided scribe methods. In other embodiments, the present method provides higher process yields at the scribe and break process steps than conventional methods. Additionally, there is a reduced incidence of chip-outs, as well as doublets (pairs of chips that are not separated during the break step). In other embodiments, the scribed regions may induce surface roughening on the side-walls of the generated LED chips which may enhance light extraction from the chips when compared to chips generated by scribing on a single side.

In other embodiments, the present method can also include other variations, combinations, and modifications, as described below.

1. The LED wafer may be a c-plane GaN wafer
2. An individual LED wafer may be scribed on at least one of the two surfaces using at least one of a plurality of scribe methods in other embodiments. The scribe methods may include at least two or more methods selected from laser scribing, diamond scribing, and sawing/dicing.
3. In a specific embodiment, the scribe depth on any one side of the LED wafer may be varied between 0.5% and 99.5% of the thickness of the LED wafer.
4. In an alternative embodiment, the scribed regions may have continuous scribe lines, or may comprise of dashed or dotted scribe lines. The scribed regions along two or more axes may or may not intersect in the regions defined by intersecting 'scribe streets,' by design according to a specific embodiment.
5. Also, scribing may be performed along at least one 'scribe street' orientation on a first surface, and along at least one 'scribe street' orientation on the second surface, such that at least two 'scribe street' orientations chosen are non-parallel according to a specific embodiment.
6. The scribed LED wafer may be broken using a method or a plurality of methods chosen from a group including anvil breaker, roller breaker or breaker bar, combinations, and the like.

While the above is a full description of the specific embodiments, various modifications, alternative constructions and equivalents may be used. The present specification describes one or more specific gallium and nitrogen containing surface orientations, but it would be recognized that any one of a plurality of family of plane orientations can be used. The above description and illustrations should not be taken as limiting the scope of the present invention which is defined by the appended claims.

What is claimed is:

1. A light emitting diode (LED) device made from the process comprising:
   (a) overlaying an epitaxial structure on a substrate having planes to form a processed wafer, wherein said planes are non-m-planes;
   (b) scribing said processed wafer to form scribe lines along at least a portion of said planes to define a plurality of triangular portions of said processed wafer; and
   (c) singulating said triangular portions by breaking along said scribe lines to define an LED device having three sides along at least a portion of said planes of said substrate, wherein breaking creates a textured surface on one or more of said sides, wherein said textured surface comprises striations, said textured surface being configured to improve light extraction compared to a smooth surface.

2. The LED device of claim 1, wherein said planes are a-planes.

3. The LED device of claim 2, wherein said optical device comprises no more than five sides, wherein two sides of said five sides have a triangular shape and are configured from equivalent crystal planes.

4. The LED device of claim 3, wherein said equivalent crystal planes are c-planes.

5. The LED device of claim 1, wherein all of said three sides comprise said textured surface.

6. The LED device of claim 5, wherein said three sides comprise said textured surface to facilitate a light extraction efficiency of over 80%.

7. The LED device of claim 1, wherein said three sides are perpendicular to top and bottom sides of said LED device, and said striations are perpendicular to said top and bottom sides.

8. The LED device of claim 1, wherein said substrate comprises bulk GaN.

9. The LED device of claim 8, wherein said light-emitting epitaxial structure comprises GaN.

10. The LED device of claim 1, wherein said optical device has only five sides.

11. A process of preparing a light emitting diode (LED) comprising:
    (a) overlaying an epitaxial structure on a substrate having planes to form a processed wafer, wherein said planes are a-planes;
    (b) scribing said processed wafer to form scribe lines along at least a portion of said planes to define a plurality of triangular portions of said processed wafer; and
    (c) singulating said triangular portions by breaking along said scribe lines to define an LED device having three sides along at least a portion of said planes of said substrate, wherein breaking creates a textured surface on one or more of said sides, wherein said textured surface comprises striations, said textured surface being configured to improve light extraction compared to a smooth surface.

12. The process of claim 11, wherein said optical device comprises no more than five sides, wherein two sides of said five sides have a triangular shape and are configured from equivalent crystal planes.

13. The process of claim 11, wherein said three sides comprise said textured surface.

14. The process of claim 11, wherein said three sides are perpendicular to top and bottom sides of said process, and said striations are perpendicular to said top and bottom sides.

15. The process of claim 11, wherein said substrate comprises bulk GaN.

16. The process of claim 15, wherein said light-emitting epitaxial structure comprises GaN.

* * * * *